US006875662B2

(12) United States Patent
Iwasaki et al.

(10) Patent No.: US 6,875,662 B2
(45) Date of Patent: Apr. 5, 2005

(54) SEMICONDUCTOR DEVICE

(75) Inventors: Tomio Iwasaki, Tsukuba (JP); Hideo Miura, Sendai (JP)

(73) Assignees: Hitachi, Ltd., Tokyo (JP); Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/641,123

(22) Filed: Aug. 15, 2003

(65) Prior Publication Data

US 2004/0046217 A1 Mar. 11, 2004

(30) Foreign Application Priority Data

Sep. 6, 2002 (JP) .................................. 2002-261896

(51) Int. Cl.[7] .............................................. H01L 21/336
(52) U.S. Cl. ...................................... 438/287; 257/410
(58) Field of Search .................................. 438/216, 261, 438/287, 581, 582, 591, 592, 785; 257/310, 405, 406, 410, 411, 413, E21.547, E21.625, E21.639

(56) References Cited

U.S. PATENT DOCUMENTS

| | | | | |
|---|---|---|---|---|
| 6,060,755 A | * | 5/2000 | Ma et al. | 257/410 |
| 6,489,648 B2 | * | 12/2002 | Iwasaki et al. | 257/310 |
| 2003/0030117 A1 | * | 2/2003 | Iwasaki et al. | 257/411 |

OTHER PUBLICATIONS

Lecture No. 3.3 of the Extended Abstracts of International Workshop on Gate Insulator 2001, pp 56–60, Nov. 1–2, 2001.

Benito deCelis, et al. *Journal of Applied Physics*, Molecular dynamics simulation of crack tip processes in alpha–iron and cooper, vol. 54 (1984), p 4877.

Dr. Dieter W. Heermann, "Computer Simulation Methods in Theoretical Physics (1989)", Spring Verlag, pp 23–25.

T. Kwok, et al., Physical Review B, "Molecular–dynamics studies of grain–boundary diffusion. II Vacancy migration, diffusion mechanism, and kinetics", May 15, 1984, vol. 29, pp 5367–5369.

N. Bernstein, et al., Physical Review B, "Amorphous–crystal Interface in silicon: A tight–binding simulation", Aug. 15, 1998–II, vol. 58, pp 4579–4581.

\* cited by examiner

*Primary Examiner*—Olik Chaudhuri
*Assistant Examiner*—Brook Kebede
(74) *Attorney, Agent, or Firm*—Antonelli, Terry, Stout & Kraus, LLP

(57) ABSTRACT

The invention offers a highly reliable semiconductor device with high yields. The semiconductor device includes a silicon substrate, a gate insulating film formed on one main plane of a silicon substrate and mainly including zirconium oxide of hafnium oxide, and a gate electrode film formed in contact with the gate insulating film. The gate insulating film contains an additional element for stabilizing the amorphous state.

16 Claims, 6 Drawing Sheets

TWO-BODY CORRELATION FUNCTION OF ZIRCONIUM OXIDE

TWO-BODY CORRELATION FUNCTION OF ZIRCONIUM OXIDE
WITH TANTALUM OF 10 at.% ADDED

DEFINITION OF PEAK HEIGHT

SEMICONDUCTOR DEVICE

BACKGROUND OF THE INVENTION

The present invention relates to a semiconductor device composed using a material of a high permittivity, and more particularly to the semiconductor device provided with a gate structure composed using the material of a high permittivity.

As the semiconductor device is made finer, the gate length of the transistor becomes as short as 0.15 µm. Hence, the thickness of a gate insulating film is requested to be as thin as 2 nm or less in the case of composing the gate insulating film using $SiO_2$. Such a thin insulating film as that causes a non-negligible amount of current to be tunneled through the insulating film itself. It has been thus considered that the physical thickness of the insulating film is made thicker as keeping the high permittivity characteristic by using an insulating material of a higher permittivity than $SiO_2$.

As candidates for the material of a high permittivity, aluminum oxide, zirconium oxide, hafnium oxide, and so forth may be referred. (For example, see the Lecture No. 3.3 (pages 56 to 60) of the Extended Abstracts of International Workshop on Gate Insulator 2001.)

SUMMARY OF THE INVENTION

Since the relative permittivity of the aluminum oxide is about 7, the aluminum oxide does not offer a high permittivity. As disclosed in the foregoing publication, the aluminum oxide has a stable amorphous phase, while the zirconium oxide and the hafnium oxide has a relatively less stable amorphous phase, so that they are likely to be polycrystalline even at as low a temperature as 500° C.

In the polycrystalline state, the crystal grains are not distributed uniformly. It means that the use of the zirconium oxide or hafnium oxide as the gate insulating film results in disadvantageously making the distribution of a leak current non-uniform.

It is an object of the present invention to provide a semiconductor device which is composed to be highly reliable to an insulating film and have a high yield.

It is a further object of the present invention to provide a semiconductor device which includes a gate structure with a stable leak characteristic.

It is another object of the present invention to provide a semiconductor device which includes an insulating film of a high permittivity having a stable amorphous phase.

In carrying out the foregoing objects, according to an aspect of the invention, a semiconductor device includes a semiconductor substrate, a gate insulating film formed on one main plane of the semiconductor substrate and having zirconium oxide as a main component material, and the gate insulating film containing tantalum whose density ranges 8 to 25 at. %. It is preferable that the main component material of the gate electrode film is tantalum silicide or tantalum nitride.

The gate insulating film may also contain tungsten at a density of 10 to 23 at. %. In this case, it is preferable that the main component material of the gate electrode film is tungsten silicide or tungsten nitride.

Further, the gate insulating film may also contain molybdenum at a density of 11 to 22 at. %. In this case, it is preferable that the main component material of the gate electrode film is molybdenum silicide or molybdenum nitride.

According to another aspect of the invention, the semiconductor device includes a semiconductor substrate, a gate insulating film formed on one main side of the semiconductor substrate and having hafnium oxide as the main component material, and a gate electrode film formed in contact with the gate insulating film, and the gate insulating film containing tantalum at a density of 5 to 28 at. %.

The gate insulating film may contain tungsten at a density of 7 to 26 at. %. In this case, it is preferable that the main component material of the gate electrode film is tungsten silicide.

According to another aspect of the invention, the gate insulating film may contain molybdenum at a density of 8 to 26 at. %. In this case, it is preferable that the main component material of the gate electrode film is molybdenum silicide or molybdenum nitride.

Other objects, features and advantages of the invention will become apparent from the following description of the embodiments of the invention taken in conjunction with the accompanying drawings.

DETAILED DESCRIPTION OF THE EMBODIMENTS

Throughout the present description, silicon (Si) atoms may be intentionally contained in the gate insulating film. In the manufacturing process, carbon (C) atoms or hydrogen (H) atoms may be contained therein. In these cases, the description of "the main component material is zirconium oxide or hafnium oxide" means that the gate insulating film is mainly composed of zirconium oxide or hafnium oxide. In addition, the content of Si atoms may prevent mutual diffusion on the interface between the substrate and the gate insulating film.

The inventors have diligently made a study of means of stabilizing an amorphous phase of a gate insulating film having zirconium oxide or hafnium oxide as the main component. As a result, they found that the addition of tantalum, tungsten, and molybdenum to zirconium oxide is effective in stabilizing the amorphous phase.

Moreover, the inventors also found the following facts. In the case of using the gate insulating film composed of zirconium oxide or hafnium oxide with tantalum added, the use of tantalum silicide or tantalum nitride as the main component material of the gate electrode is effective in suppressing mutual diffusion on the interface between the gate insulating film and the gate electrode. In the case of using the gate insulating film composed of zirconium oxide or hafnium oxide with tungsten added, the use of tungsten silicide or tungsten nitride as the main component material of the gate electrode is effective in suppressing mutual diffusion on the interface between the gate insulating film and the gate electrode. In the case of using the gate insulating film composed of zirconium oxide or hafnium oxide with molybdenum added, the use of molybdenum silicide or molybdenum nitride as the main component material of the gate electrode is effective in suppressing mutual diffusion on the interface between the gate insulating film and the gate electrode.

It is likelihood that the addition of tantalum, molybdenum, or tungsten to the gate insulating film is advantageously brings about a quasi-stable state in the gate insulating film. For example, the amorphous state may be more easily maintained even after a heat treatment of 900° C.

Figure 1:
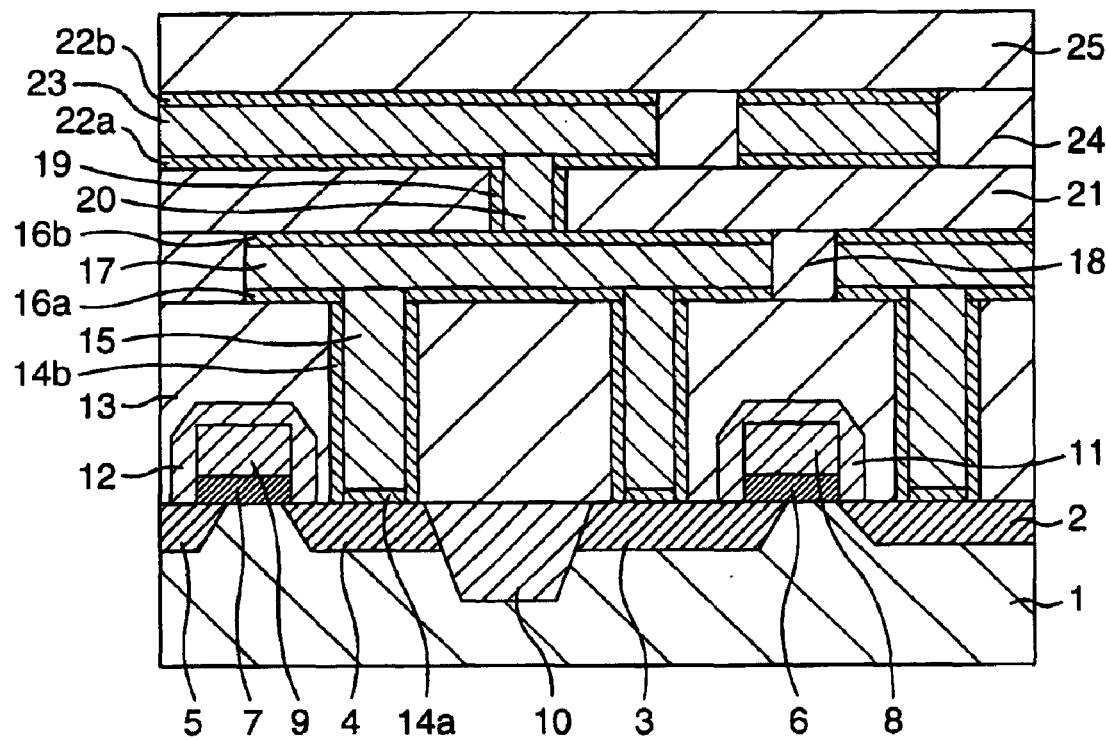
FIG. 1 is a sectional view showing an essential part of a semiconductor device according to a first embodiment of the present invention.

Hereafter, the semiconductor device according to the embodiment of the present invention will be described with reference to the appended drawings. At first, FIG. 1 shows a sectional structure of the essential part of the semiconductor device according to the first embodiment of the invention. As shown in FIG. 1, numerals 2 to 5 denote diffusion layers, which are formed on a silicon substrate 1. On the diffusion layers 2 to 5 are formed gate insulating films 6, 7 and gate electrodes 8, 9, all of which compose a MOS type transistor.

The gate insulating film 6 or 7 is mainly composed of zirconium oxide or hafnium oxide. This is for meeting the requirement of fining and enhancing the functionality of the gate insulating film. This gate insulating film 6 or 7 is formed by means of, for example, the chemical gaseous evaporation technique or the sputtering technique. In this case, for keeping the amorphous state stable, tantalum, tungsten, or molybdenum may be contained as an additive element in this gate insulating film 6 or 7. This lessens a variation of leak characteristic.

In order to suppress the mutual diffusion on the interface between the gate insulating film 6 or 7 and the gate electrode 8 or 9 and keep an element composition of the gate insulating film stable, it is preferable to use tantalum silicide or tantalum nitride, tungsten silicide or tungsten nitride, or molybdenum silicide or molybdenum nitride as the main component material of the gate electrode 8 or 9 according to the foregoing added element.

The gate electrode 8 or 9 may be formed using, for example, the chemical gaseous evaporation technique or the sputtering technique. Each MOS transistor is separated by a cell separating film composed of a silicon oxide film, for example. On the top and the side wall of the gate electrode 8 or 9 is formed an insulating film 11 or 12 composed of silicon oxide film, for example. On the overall top of the MOS transistor is formed an insulating film 13, which is composed of a BPSG (Boron-Doped Phospho Silicate Glass) film, an SOG (Spin On Glass) film, a silicon oxide film, or a nitride film, the latter two of which are formed by the chemical gaseous evaporation technique or the sputtering technique.

In the contact hole formed in the insulating film 13 is formed a plug composed of a main conductor film 15 covered with barrier adjacent conductor films (first conductor films) 14a and 14b for preventing the mutual diffusion. The plugs are connected from the diffusion layers 2 to 5. Through the plugs, a first laminated wire composed of a main conductor film 17 covered with adjacent conductor films 16a and 16b for preventing the mutual diffusion is connected with the diffusion layers 2 to 5. This laminated wire is formed by coating the adjacent conductor film 16a with the sputtering technique or the like, coating the main conductor film 17 with the sputtering technique or the like, forming the adjacent conductor film 16b on the main conductor film 17 with the sputtering technique or the like, and etching the result for forming the wiring pattern.

On the top of the first laminated wire is formed a plug 20 composed of a main conductor film covered with the barrier adjacent conductor films 19. The plug 20 is composed in the contact hole formed in the insulating film 21. The plug 20 is connected with the laminated wire. Through this plug 20, a second laminated wire is connected with the first laminated wire. The second laminated wire is composed of a main conductor film 23 covered with the barrier adjacent conductor films 22a and 22b. This second laminated wire is obtained by forming the barrier adjacent conductor film 22a with the sputtering technique or the like, the main conductor film 23 with the sputtering technique or the like, and the barrier adjacent conductor film 22b on the main conductor film 23 with the sputtering technique or the like, and etching the result for forming a wiring pattern.

The advantage of the semiconductor according to this embodiment will be described below. For analyzing this semiconductor device in detail, the molecular dynamics simulation is carried out. The analyzed result will be indicated below. As described in Journal of Applied Physics, Vol. 54 (issued in 1983), page 4877, for example, the molecular dynamics simulation is the method of calculating the position of each atom at each time by calculating a force exerted on each atom through an intra-atom potential and solving the Newton's equation of motion based on the force. In this embodiment, by introducing the charge motion into the molecular dynamics method and calculating the mutual reaction between different elements, the below-discussed relation was obtained.

The semiconductor according to this embodiment has an advantage of thermally stabilizing the amorphous state of the gate insulating film by containing the added element. The stability of the amorphous state may be indicated by calculated a two-body correlation function. The method of calculating the two-body correlation function through the molecular dynamics is described in pages 23 to 25 of Computer Simulation Methods in Theoretical Physics (1989, issued by Springer Verlag). The analysis is executed by means of this method. Further, the semiconductor device according to this embodiment has an advantage of suppressing the mutual diffusion of the added element on the interface between the gate insulating film and the gate electrode by using the same element as this added element as the component element of the gate electrode, thereby keeping the composition stable.

Hence, this advantage may be provided by calculating a diffusion coefficient of the added element and analyzing the dependency of the added element on the gate electrode material. The method of calculating the diffusion coefficient through the effect of the molecular dynamics simulation is described in Physical Review B, Vol. 29 (issued in 1984), pages 5367 to 5369.

At first, the effect provided by the stable amorphous state of the gate insulating film will be described by using the calculated result of the two-body correlation function g(r). For discriminating the amorphous state from the crystalline state through the use of the two-body correlation function g(r) was used the method of determining whether or not the peak of g(r) is located at a point in the r range of 0.4 nm to 0.5 nm. This method is described in Physical Review B, Vol. 58 (issued in 1998), page 4581. That is, if the peak is located in the r range of 0.4 to 0.5 nm, the gate insulating film is in the crystalline state, while, if it is not located in that range, it is in the amorphous state.

Figure 2:
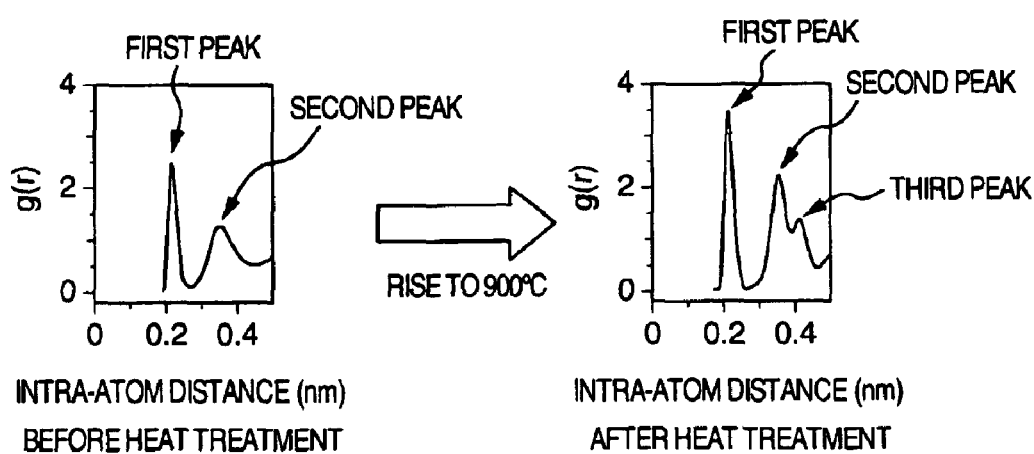
FIG. 2 is a graph showing a two-body correlation function of a zirconium oxide film having a thickness of 3 nm before or after a heat treatment of 900° C.

The calculated result of g(r) of the zirconium oxide film with no added element in the r range of 0.5 nm or less is illustrated in FIG. 2. the function g(r) shown in the left hand of FIG. 2 is derived by executing the molecular dynamics simulation of depositing zirconium atoms and oxygen atoms on an Si substrate at the temperature of 300° C. The function shown in the right hand of FIG. 2 is derived by executing the molecular dynamics simulation of raising the temperature from the previous state to 900° C. and then cooling it down to 20° C. For the graph shown in the left hand of FIG. 2 (before the heat treatment), the first peak appears when r is about 0.22 nm and the second peak appears when r is about 0.36 nm. On the other hand, for the graph shown in the right hand of FIG. 2 (after the heat treatment of 900° C.), the first peak appears when r is about 0.22 nm, the second peak appears when r is about 0.36 nm, and the third peak appears when r is about 0.42 nm. The peak indicates the location at which another atom highly probably appears far from a certain reference atom.

The first peak indicates the closest atom and the second peak indicates the second closet atom. For the graph shown in the left hand of FIG. 2 (before the heat treatment), no third peak appears, which indicates the location of the third closest atom cannot exactly grasped. It means that the zirconium oxide film is in the amorphous state. For the graph of g(r) shown in the right hand of FIG. 2 after the heat treatment of 900° C., the third peak appears when r is about 0.42 nm, which indicates the atoms are ranged more regularly. That is, after the heat treatment, the zirconium oxide film enters into not the amorphous state but the crystalline state. Hence, as to the zirconium oxide with no added element, the heat treatment of 900° C. makes the amorphous state unstable, that is, changes it into the crystalline state.

Figure 3:
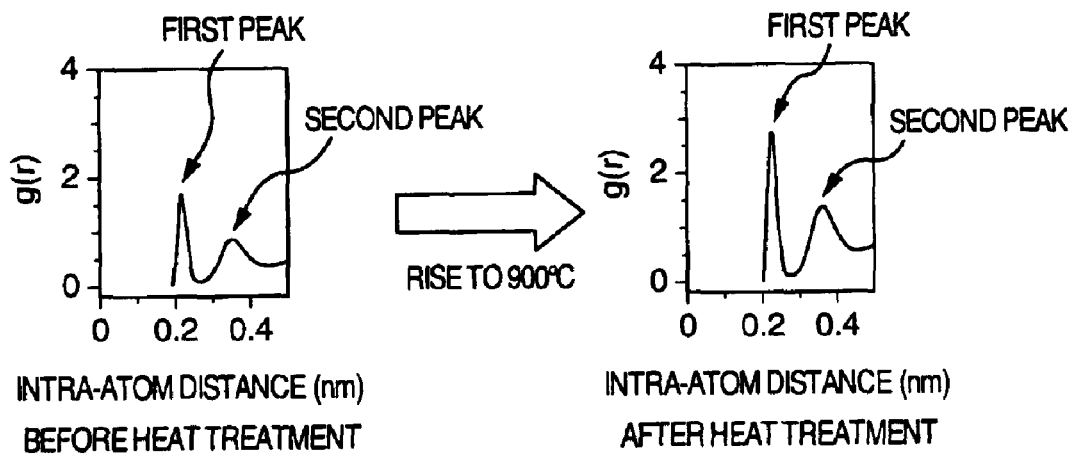
FIG. 3 is a graph showing a two-body correlation function of a zirconium oxide film having a thickness of 3 nm and a content of tantalum of 10 at. % before or after a heat treatment of 900° C.

The calculated result of g(r) of the zirconium film with tantalum of 10 at. % as the added element when r is 0.5 nm or less is illustrated in FIG. 3. The graph shown in the left-hand of FIG. 3 concerns with the function g(r) derived by carrying out the molecular dynamics simulation of depositing zirconium atoms and oxygen atoms on the Si substrate at the temperature of 300° C. for forming a film of zirconium oxide and cooling down the film into 20° C. The graph shown in the right-hand of FIG. 3 concerns with the function g(r) derived by executing the molecular dynamics simulation of raising the previous cooled state of the zirconium oxide to 900° C. and then cooling it down to 20° C. The difference of FIG. 3 (for the case of containing tantalum of 10 at. %) from FIG. 2 (for the case of containing no added element) is that no third peak appears when r is about 0.42 nm after the heat treatment of 900° C. If considered similarly to the above, even after the heat treatment, the zirconium oxide film is not made crystalline. That is, it is in the stable amorphous state.

Figure 4:
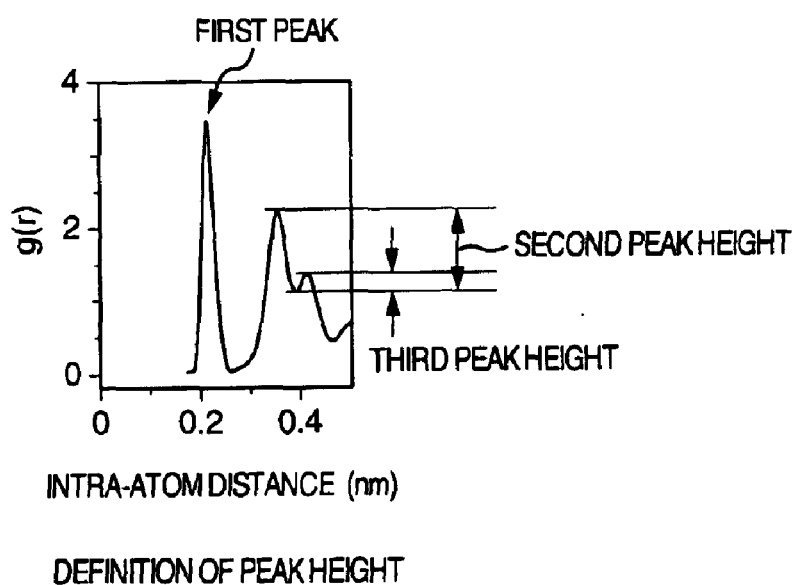
FIG. 4 is a graph for explaining a definition of a peak height of a two-body correlation function.
Figure 5:
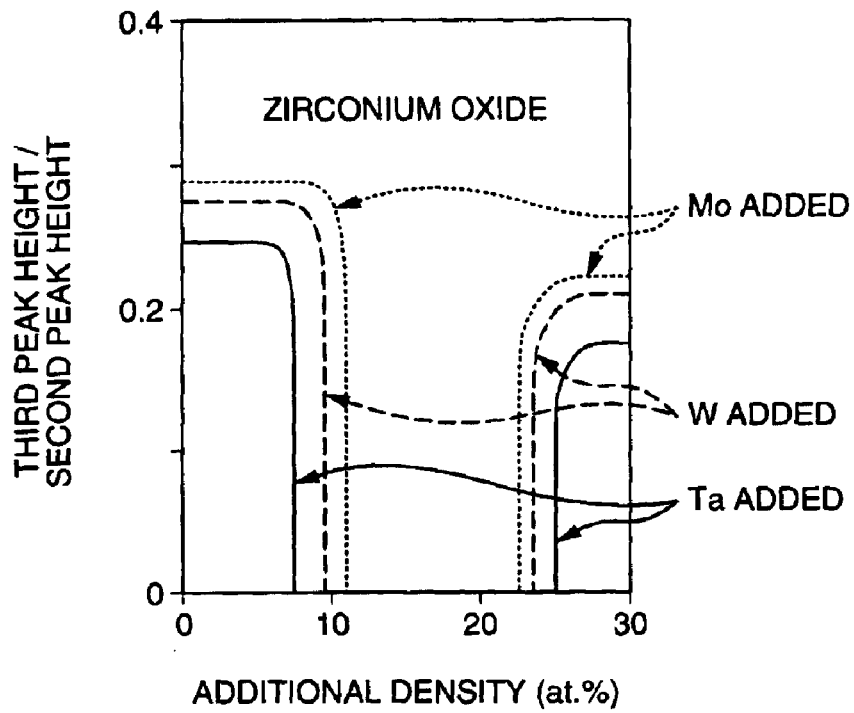
FIG. 5 is a graph showing a dependency of an additional density on a third peak height/a second peak height about a zirconium oxide film.

In order to clarify the dependency of the tantalum density in this phenomenon, a graph of FIG. 4 was depicted in which an axis of abscissa denotes a tantalum density and an axis of ordinate denotes a value of the third peak height/the second peak height at the temperature of 900° C. As shown in FIG. 4, the second peak height and the third peak height are defined as the height from the bottoms of the second peak and the third peak, respectively. The analyzed result of the dependency of the value of the third peak height/the second peak height on the additional density as to the zirconium oxide after the heat treatment of 900° C. is illustrated in real line of FIG. 5. In FIG. 5, the zirconium oxide with tungsten added and the zirconium oxide with molybdenum added are illustrated in broken line and dotted line, respectively. As to the zirconium with tantalum added, in the additional density range of 0 to 8 at. %, the value of (the third peak height/the second peak height) indicates about 0.25, while in that range of 8 to 25 at. %, the value indicates zero (0). In the tantalum additional density range of 0 to 8 at. %, the zirconium oxide is made crystalline after the heat treatment of 900° C., while in that range of 8 to 25 at. %, the zirconium oxide is made amorphous even after the heat treatment of 900° C.

As is understood from FIG. 5, when the tantalum additional density is further increased and exceeds 25 at. %, the value of the third peak height/the second peak height is about 0.18, which means that the zirconium oxide is made crystalline after the heat treatment of 900° C. Hence, in order to keep the amorphous state stable even after the heat treatment of 900° C., it is preferable to keep the tantalum density between 8 and 25 at. %. It is found from the data indicated in the broken line of FIG. 5 that in the case of adding tungsten to the zirconium oxide, even after the heat treatment of 900° C., the preferable density range for keeping the amorphous state stable is 10 to 23 at. %. Further, it is found from the data indicated in the dotted line of FIG. 5 that in the case of adding molybdenum to the zirconium oxide, the preferable density range is 11 to 22 at. %.

Figure 6:
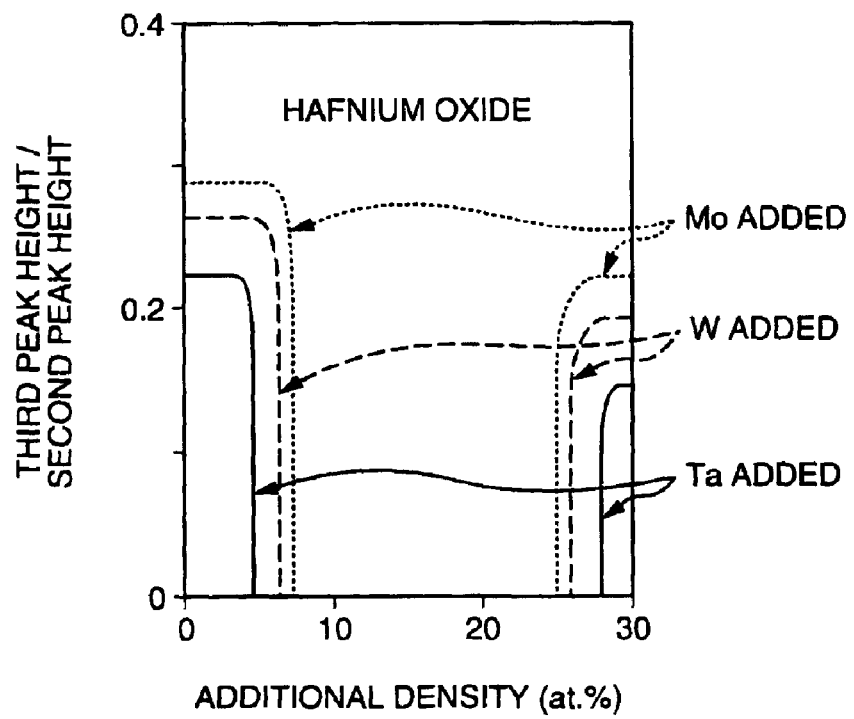
FIG. 6 is a graph showing a dependency of an additional density on a third peak height/a second peak height about a hafnium oxide film.

The same analysis of hafnium oxide as the aforementioned analysis of zirconium oxide is illustrated in FIG. 6. FIG. 6 shows the analogous pattern to that shown in FIG. 5. In the case of using the hafnium oxide as the main component material of the gate insulating film, it is found from FIG. 6 that the addition of tantalum, tungsten, or molybdenum to the hafnium oxide is effective in stabilizing the amorphous state. Concretely, it is also found from FIG. 6 that the preferable additional density ranges from 5 to 28 at. % as to the addition of tantalum, from 7 to 26 at. % as to the addition of tungsten, or from 8 to 25 at. % as to the addition of molybdenum.

According to this embodiment, in the case of adding tantalum to the gate insulating film, the gate electrode that is located in direct contact with the gate insulating film may be composed of polycrystalline silicon, which have been heretofore used for making an electrode. More preferably, tantalum silicide or tantalum nitride may be used for making the gate electrode. This is because when the added tantalum is diffused from the gate insulating film to the gate electrode, tantalum is short in the gate insulating film and thus the amorphous state is made unstable, while if tantalum silicide or tantalum nitride is used for composing the gate electrode, the diffusion of tantalum into the gate electrode is suppressed. If tantalum is escaped from the gate insulating film and thereby is short in the film, the amorphous state is made unstable.

Figure 7:
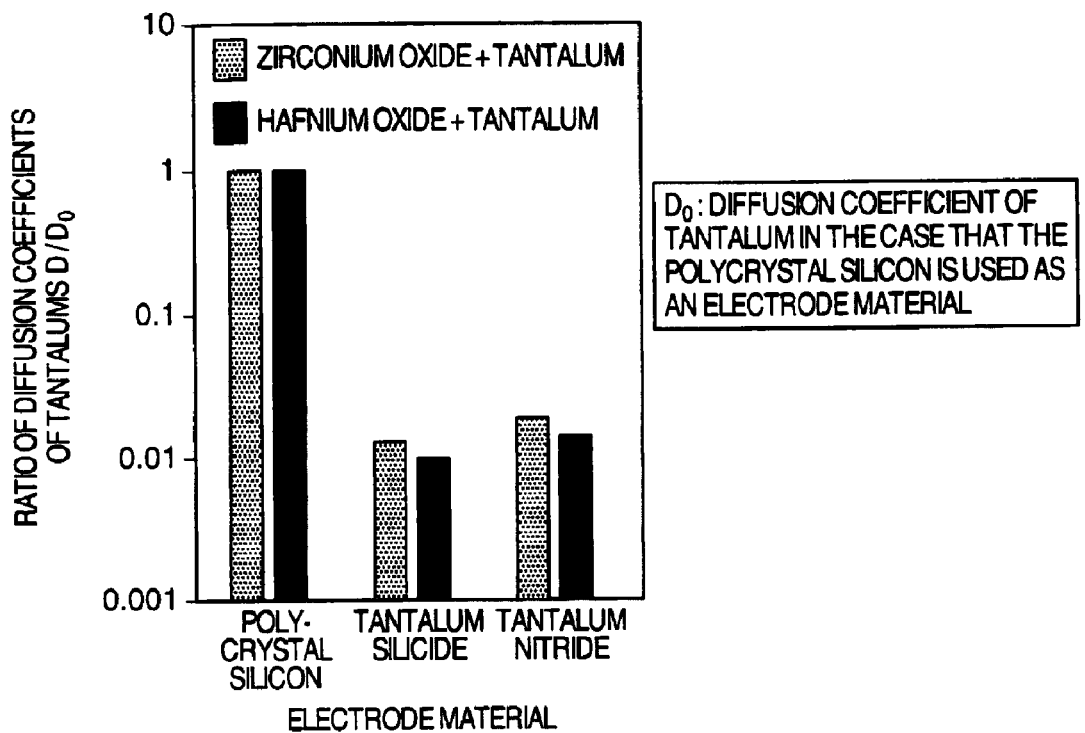
FIG. 7 is a graph showing a ratio of diffusion coefficients of tantalums at 900° C. about each electrode material.
Figure 8:
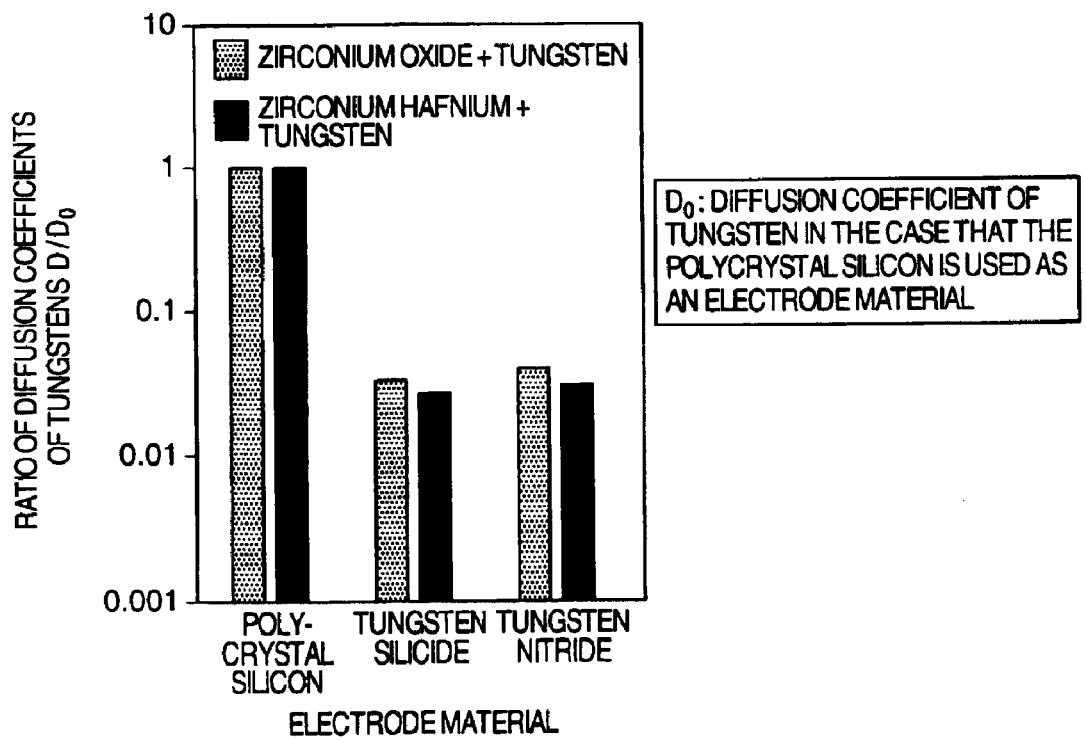
FIG. 8 is a graph showing a ratio of diffusion coefficients of tungstens at 900° C. about each electrode material.
Figure 9:
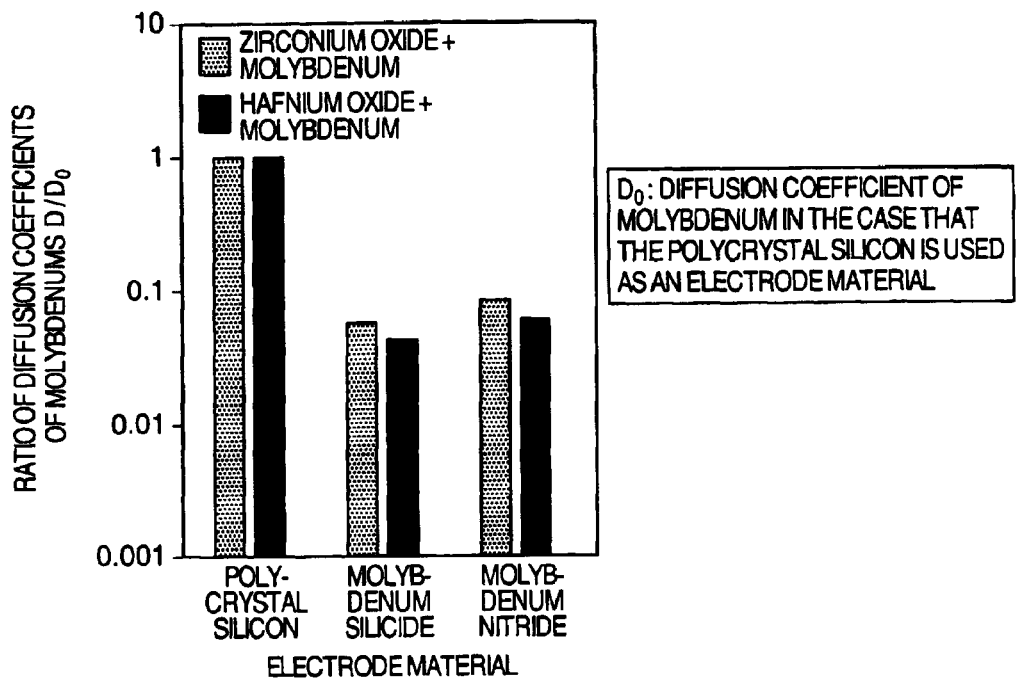
FIG. 9 is a graph showing a ratio of diffusion coefficients of molybdenums at 900° C. about each electrode material.

FIG. 7 shows the effect of suppressing the tantalum diffusion in the case of using the tantalum silicide or tantalum nitride as the electrode material. In FIG. 7, $D_0$ denotes a diffusion coefficient of tantalum in the gate insulating film in the case of making the electrode from the polycrystalline silicon. It is found from FIG. 7 that in the case of making the gate electrode from tantalum silicide or tantalum nitride, the tantalum diffusion coefficient may be reduced by a factor of 100 to 50 or less as compared with the gate electrode composed of polycrystalline silicon. As shown in FIGS. 8 and 9, this holds true to the addition of molybdenum or the addition of tungsten. That is, as shown in FIG. 8, in the case of adding tungsten to the gate insulating film, it is preferable to use tungsten silicide or tungsten nitride for making the gate electrode located in contact with the gate insulating film in place of the polycrystalline silicon that have been heretofore used for making an electrode. This is because the diffusion coefficient may be reduced by a factor of 50 to 20 or less. As is obvious from FIG. 9, in the case of adding molybdenum to the gate insulating film, it is preferable to use molybdenum silicide or molybdenum nitride for making the gate electrode located in contact with the gate insulating film in place of the polycrystalline silicon that have been heretofore used for making an electrode. This is because the diffusion coefficient may be reduced by a factor of 20 to 10 or less. The foregoing effects may be similarly offered as varying the calculating conditions such as a film thickness and a temperature.

Figure 10:
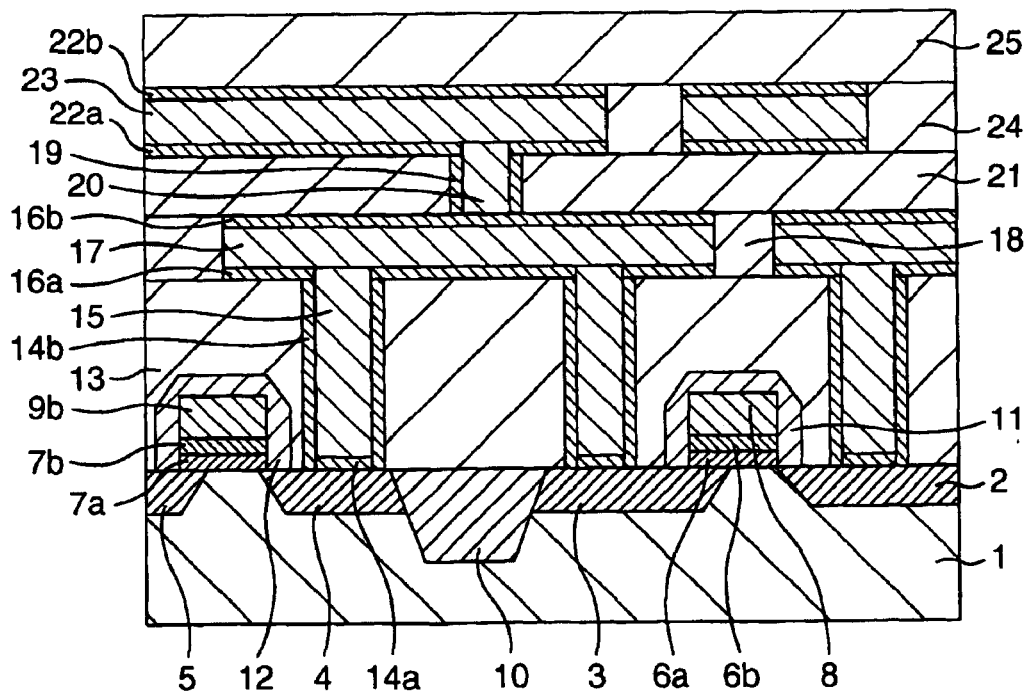
FIG. 10 is a sectional view showing an essential part of a semiconductor device according to a second embodiment of the present invention.

In turn, the description will be oriented to the semiconductor device according to the second embodiment of the invention with reference to the appended drawings. FIG. 10 is a sectional view showing an essential portion of the semiconductor device according to the embodiment of the invention. The main difference between the semiconductor device of this second embodiment and that of the first embodiment is a two-layered structure of the gate insulating film composed of first gate insulating films 6a, 7a and second gate insulating films 6b, 7b. In order to meet the requirement of fining and enhancing the function of the insulating film, the second gate insulating films 6b and 7b are composed of zirconium oxide or hafnium oxide as a main component material. To stabilize the amorphous state of the gate insulating film, like the second embodiment according to the first embodiment, tantalum, tungsten or molybdenum is added to the gate insulating film. The first gate insulating films 6a and 7a includes silicon oxide, zirconium silicate, or hafnium silicate as its main component material. This serves to prevent the silicon elements from being absorbed from the silicon substrate 1 by the gate insulating film. Though not shown, the gate insulating film may have a three or more layered structure.

Figure 11:
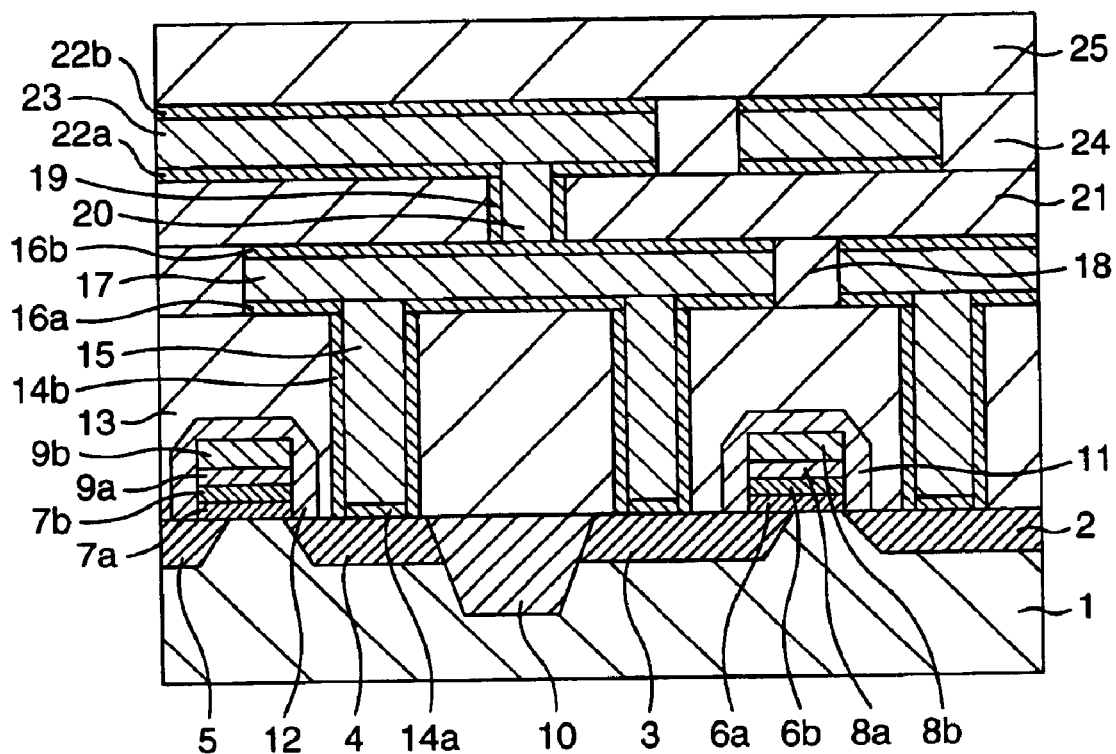
FIG. 11 is a sectional view showing an essential part of a semiconductor device according to a third embodiment of the present invention.

In turn, the description will be oriented to the semiconductor device according to the third embodiment of the invention with reference to the appended drawing. FIG. 11 shows a sectional structure of an essential portion of the semiconductor device according to this embodiment. The main difference between the semiconductor device of the third embodiment and that of the second embodiment is a two-layered structure of the gate electrode film composed of the first gate electrode films 8a, 9a and the second gate electrode films 8b, 9b. As the main component material of the first gate electrode films 8a and 9a, as mentioned above, it is preferable to use tantalum silicide, tantalum nitride, tungsten silicide, tungsten nitride, molybdenum silicide, or molybdenum nitride, all of which are unlikely to bring about diffusion. As the main component material of the second gate electrode films 8b and 9b, it is preferable to use tantalum, tungsten, or molybdenum, for reducing the electric resistance of the overall gate electrode. In this case, another conductive film may be located between the first gate electrode films 8a, 9a and the second gate electrode films 8b, 9b. In particular, in the case of using tantalum silicide, tungsten silicide, or molybdenum silicide as the main component material of the first gate electrode films 8a and 9a, in order to prevent mutual diffusion between the first gate electrode films 8a, 9a and the second gate electrode films 8b, 9b, it is preferable to locate a layer composed of tantalum nitride, tungsten nitride, or molybdenum nitride between the first and the second gate electrode films.

Figure 12:
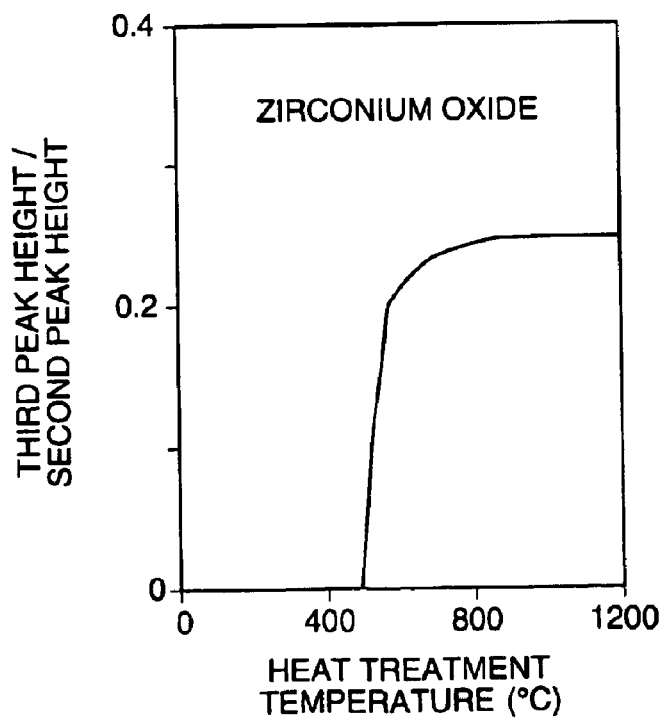
FIG. 12 is a graph showing a dependency of a heat treatment on a third peak height/a second peak height about a zirconium oxide film.

The aforementioned problem concerns with crystallization of the gate insulating film through the heat treatment. The heat treatment temperature that brings about the crystallization is shown in FIG. 12. Since the third peak appears at the temperature of about 500° C., the higher heat treatment temperature than about 500° C. is problematic. The influence of the heat treatment is to apply energy to the atoms composing the gate insulating film. For example, it is preferable to apply the technology according to this embodiment even to the semiconductor device manufactured in the manufacturing process having the step of applying energy to the atoms by the method of radiating a laser beam or the like.

The semiconductor device according to each embodiment of the invention is high in reliability and yields. Further, the semiconductor device includes a gate structure with a stable leak characteristic and a gate insulating film of a high permittivity with the stable amorphous phase.

As set forth above, the present invention has been described along the embodiments. However, the present invention is not limited by those embodiments. It is easily understood by the skilled persons in this art that various modifications, changes, and combinations are made possible. For example, in each of those embodiments, the description has concerned with the MOSFT gate electrode. In actual, the gate electrode material and the gate insulating film may be applied to the electrode and the capacitor insulating film of the MOS-structured capacitor element. Further, it is possible to use the foregoing material as the gate insulating film but to use the commonly available polycrystalline silicon as the gate electrode.

The present invention offers a highly reliable semiconductor device. Moreover, the semiconductor device is high in yields. Further, the invention offers the semiconductor device that includes the gate insulating film of a high permittivity with a stable amorphous phase.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
   a semiconductor substrate;
   a gate insulating film formed on one main plane of said semiconductor substrate and including zirconium oxide as its main component material;
   a gate electrode film formed in contact with said gate insulating film; and said gate insulating film containing tantalum at a density of 8 to 25 at. %.

2. A semiconductor device as claimed in claim 1, wherein said gate electrode film includes tantalum silicide or tantalum nitride as its main component material.

3. A semiconductor device comprising:

a semiconductor substrate;

a gate insulating film formed on one main plane of said semiconductor substrate and including zirconium oxide as its main component material;

a gate electrode film formed in contact with said gate insulating film; and said gate insulating film containing tungsten at a density of 10 to 23 at. %.

4. A semiconductor device as claimed in claim 3, wherein said gate electrode film is includes tungsten silicide or tungsten nitride as its main component material.

5. A semiconductor device comprising:

a semiconductor substrate;

a gate insulating film formed on one main plane of said semiconductor substrate and including zirconium oxide as its main component material;

a gate electrode film formed in contact with said gate insulating film; and said gate insulating film containing molybdenum at a density of 11 to 22 at. %.

6. A semiconductor device as claimed in claim 5, wherein said gate electrode film includes molybdenum silicide or molybdenum nitride as its main component material.

7. A semiconductor device comprising:

a semiconductor device;

a gate insulating film formed on one main plane of said semiconductor substrate and including hafnium oxide as its main component material;

a gate electrode film formed in contact with said gate insulating film; and said gate insulating film containing tantalum at a density of 5 to 28 at. %.

8. A semiconductor device as claimed in claim 7, wherein said gate electrode film includes tantalum silicide or tantalum nitride as its main component material.

9. A semiconductor device comprising:

a semiconductor substrate;

a gate insulating film formed on one main plane of said semiconductor substrate and including hafnium oxide as its main component material;

a gate electrode film formed in contact with said gate insulating film; and said gate insulating film containing tungsten at a density of 7 to 26 at. %.

10. A semiconductor device as claimed in claim 9, wherein said gate electrode film includes tungsten silicide or tungsten nitride as its component material.

11. A semiconductor device comprising:

a semiconductor substrate;

a gate insulating film formed on one main plane of said semiconductor substrate and including hafnium oxide as its main component material;

a gate electrode film formed in contact with said gate insulating film; and said gate insulating film containing molybdenum at a density of 8 to 25 at. %.

12. A semiconductor device as claimed in claim 11, wherein said gate electrode film includes molybdenum silicide or molybdenum nitride as its component material.

13. A semiconductor device comprising:

a semiconductor substrate;

an insulating film formed on one main surface of said semiconductor substrate and including zirconium oxide or hafnium oxide as its main component material;

an electrode film formed in contact with said gate insulating film; and said insulating film containing any one element of tantalum, molybdenum, and tungsten at a density of 5 to 28 at. %.

14. A semiconductor device as claimed in claim 13, wherein said electrode film includes silicide or nitride of one of said elements as its main component material.

15. A method for fabricating a semiconductor device comprising the steps of:

forming a gate insulating film on one main plane of said semiconductor substrate, said gate insulating film including zirconium oxide as a main component material; and forming a gate electrode film on said gate insulating film, wherein said gate insulating film contains tantalum at a density of 8 to 25 at. %, or said gate insulating film contains tungsten at a density of 10 to 23 at. %, or said gate insulating film contains molybdenum at a density of 11 to 22 at. %.

16. A method for fabricating a semiconductor device comprising the steps of:

forming a gate insulating film on one main plane of said semiconductor substrate, said gate insulating film including hafnium oxide as a main component material; and forming a gate electrode film on said gate insulating film, wherein said gate insulating film contains tantalum at a density of 5 to 28 at. %, or said gate insulating film contains tungsten at a density of 7 to 26 at. %, or said gate insulating film contains molybdenum at a density of 8 to 25 at. %.

* * * * *